United States Patent [19]
Denes et al.

[11] Patent Number: 6,054,018
[45] Date of Patent: Apr. 25, 2000

[54] OUTSIDE CHAMBER SEALING ROLLER SYSTEM FOR SURFACE TREATMENT GAS REACTORS

[75] Inventors: Ferencz S. Denes, Madison; Robert J. Sandberg, Verona, both of Wis.

[73] Assignee: Wisconsin Alumni Research Foundation, Madison, Wis.

[21] Appl. No.: 09/141,542

[22] Filed: Aug. 28, 1998

[51] Int. Cl.$^7$ ..................................................... C23F 1/02
[52] U.S. Cl. ................... 156/345; 422/186.05; 118/719; 118/723 E
[58] Field of Search ............................ 156/345; 118/719, 118/723 E; 422/186.05

[56] References Cited

U.S. PATENT DOCUMENTS

| | | |
|---|---|---|
| 5,114,770 | 5/1992 | Echizen et al. . |
| 5,130,170 | 7/1992 | Kanai et al. . |
| 5,314,539 | 5/1994 | Brown et al. . |
| 5,397,395 | 3/1995 | Sano et al. . |
| 5,458,856 | 10/1995 | Marie et al. . |
| 5,523,124 | 6/1996 | Slootman et al. . |
| 5,527,629 | 6/1996 | Gastiger et al. . |
| 5,576,076 | 11/1996 | Slootman et al. . |

FOREIGN PATENT DOCUMENTS 622474   11/1994   European Pat. Off. .

OTHER PUBLICATIONS

K.W. Gerstenberg, "A reactor for plasma polymerization on polymer films", Materials Science and Engineering, A139, pp. 110–119, 1991.

J.C. Rostaing, et al., "Silicon–based, protective transparent multilayer coatings deposited at high rate on optical polymers by dual–mode MW/r.f. PECVD", Thin Film Solids, 236, pp. 58–63, 1993.

J.C. Rostaing, et al., "Highly homogeneous silica coatings for optical and protective applications deposited by PECVD at room temperature in a planar uniform distributed electron cyclotron resonance plasma reactor", Thin Film Solids 270, pp. 49–54, 1995.

E. Prinz, et al., Aldyne—A new high–quality, stable surface treatment for plastic films, paper, and metal foils, Flexo & Gravure International, pp. 64–66, Mar., 1996.

RK Print–Coat Instruments Ltd., Rotary Koater product information.

S.D. Lee, et al., "Surface Modification of Polymeric Films under Reactive–Gas Corona–Discharge Conditions", overhead slides presented Jun., 1997.

*Primary Examiner*—Richard Bueker
*Attorney, Agent, or Firm*—Foley & Lardner

[57] ABSTRACT

A surface treatment gas reactor features a roller assembly for transporting a bi-dimensional material into and out of a gas reaction chamber. Either a four-roller or a three-roller assembly may be employed. The roller assembly is configured such that the surface area of the rollers in the roller assembly which are exposed to the interior of the reaction chamber is minimized. Thus, most of the rollers in the roller assembly are located outside of the reaction chamber. Active volume of the reaction chamber is reduced to a minimum by a large freely rotating roller and a specially shaped support piece mounted in the reaction chamber to occupy most of the dead volume in the reaction chamber. A bi-dimensional substrate to be treated is transported by the roller system and the freely rotating roller through a plasma generated in the reaction chamber by electrodes mounted in a removable electrode holder within the chamber. Axial ends of the rollers in the roller system are sealed with minimum surface contact. A gas channeling mechanism is employed to avoid displacement of the bi-dimensional substrate being treated during evacuation of the reaction chamber.

45 Claims, 3 Drawing Sheets

OUTSIDE CHAMBER SEALING ROLLER SYSTEM FOR SURFACE TREATMENT GAS REACTORS

This invention was made with United States government support awarding by the following agencies: NSF Grant No. 8721545. The United States has certain rights in this invention.

FIELD OF INVENTION

The present invention pertains generally to methods and devices for surface treatment of bi-dimensional substrates using plasmas generated, for example, using corona discharge and RF-plasma technology, and more particularly to methods and devices for transporting a continuous bi-dimensional substrate material through a gas reaction chamber while maintaining a seal between the chamber and the outside environment.

BACKGROUND OF THE INVENTION

The utility of natural and synthetic bi-dimensional substrates (i.e., web materials such as films, woven and non-woven fabrics, paper, etc.) can be enhanced by surface treatment of the substrate to tailor the substrate surface characteristics. For example, a bi-dimensional substrate may be coated to improve the barrier properties of the substrate material. The surface energy of a bi-dimensional substrate may be altered to improve wettability for improved printing, gluing, or coating of the substrate. The electrical polarity of a bi-dimensional substrate may be altered to improve the adhesivity of the material. The surface resistance of a substrate material may be altered to improve electrostatic properties. The coefficient of friction of a bi-dimensional substrate may be adjusted to improve or reduce slipping of the material. In general, surface treatment may be used to create high value added materials from more economical materials.

A conventional and traditional method for surface modification of bi-dimensional substrates is wet surface modification. By this method, a surface treatment material, such as a coating medium, in liquid form, is applied to the substrate surface. The liquid surface treatment material may be applied to the substrate surface by, for example, spraying or extruding the material onto the substrate surface or dipping the substrate into the treatment material.

Another, and more advanced, method for surface treatment of bi-dimensional substrates is plasma treatment. For plasma treatment, a substrate to be treated is placed in a reaction chamber along with a reactive gaseous material. The reaction chamber may be sealed, and the gas pressure level within the sealed reaction chamber set to a desired pressure level. Electrodes are positioned within the reaction chamber close to the substrate surface to be treated. A high voltage current signal (DC, AC, or high frequency (RF) depending upon the surface treatment material and process employed) is applied to the electrodes. The resulting electron discharge generates a plasma near the surface of the substrate being treated. A potential (such as ground potential) may be applied to or near the substrate material to draw the plasma into the material. Plasma treatment modifies the chemical nature of the surface layer of a substrate material, thereby affecting the surface properties of the material in the desired manner. Plasma treatment may be used to improve the bonding of coatings such as adhesives, dyes, inks, polymers and photographic emulsions to the bi-dimensional substrate, to improve the wettability of hydrophobic materials, or to alter mechanical properties, such as the coefficient of friction or the cohesiveness of textile fibers. In another variation, polymer films may be deposited on most surfaces by plasma polyermization from a discharge in an appropriate gaseous monomer. Apart from their potential use as bonding layers, such thin films find other possible uses, including protective and decorative layers, optical coatings, capacitor dielectrics and semi-permeable membranes.

Most of the research carried out in the field of surface treatment of organic and inorganic substrates under various plasma conditions is based on batch-type processing. Batch-type processing involves loading a substrate to be treated into a vacuum chamber, evacuating the vacuum chamber (typically while admitting a reactive gas from which the plasma will be generated into the vacuum chamber), processing to provide the desired surface treatment by generating a plasma, re-pressurizing the vacuum chamber, and unloading the finished treated substrate. This process must be repeated for each substrate to be treated. It is apparent that batch-type processing requires many steps, is costly, and cannot achieve high-productivity rates. Thus, plasma-based surface treatment by batch-type processing is not technologically or economically feasible for many industrial applications. This is especially true for the surface treatment of continuous filaments, webs, films, and the like. The treatment of such materials is only cost-affective if such substrates can be transported into a reaction chamber, through a plasma zone, and evacuated from the reaction chamber in a continuous manner without affecting the pressure level within the reaction chamber, allowing outside air into the reaction chamber, or allowing gaseous plasma components to escape from the reaction chamber. Various methods and systems have attempted to achieve a continuous flow of bi-dimensional substrate material to be treated through a sealed reaction chamber.

A basic approach for surface treating continuous uni-dimensional or bi-dimensional materials in a plasma chamber is to pass the material to be treated into and out of the chamber through a narrow hole or slot in the chamber. Such so-called slot seals are not very affective. Slot seal systems are characterized by high gas-leak rates into the reaction chamber through the slot seals. As a consequence, high pumping rates are required to maintain a desired pressure level within the chamber. Also, due to the open slot nature of the "slot sealing," significant environmental gas contamination dominates the treatment process.

Another sealing system which has been employed uses liquid seals. In such systems, the continuous bi-dimensional material to be treated is passed through a liquid barrier into and out of the treatment chamber. A liquid seal can provide a more effective seal between the interior of the treatment chamber and the outside environment than a slot seal. However, liquid sealing systems are not popular due to the contamination effects of the sealing liquids. Even if the solid material to be treated and the liquid sealing material are dissimilar, small liquid quantities retained on film and web surfaces through dispersion and capillary forces can induce undesired deposition effects under the discharge environment within the treatment chamber.

Belt sealing systems have also been employed to transport a continuous flow of bi-dimensional material to be treated into and out of a reaction chamber. However, such systems are complex and generally ineffective. Belt sealing systems do not provide sure vacuum sealing, and will not allow low pressure operations to be achieved.

The most promising approaches for sealing a vacuum reaction chamber while transporting a bi-dimensional substrate through a reaction zone within the chamber employ roller seals. Noncompliant and/or compliant rollers, depending on the nature of the substrate, are employed to transport the bi-dimensional substrate into and out of the reaction chamber. A seal is achieved between the roller surfaces and the surfaces of the bi-dimensional substrate at transport contact points between the rollers. Non-compliant rollers alone do not allow proper control of the pressure exerted by the rollers on the substrate. Compliant rollers alone create serious friction problems on roller-housing surfaces. Therefore, a combination of non-compliant and compliant rollers is typically employed.

An exemplary known apparatus for plasma treatment of continuous bi-dimensional substrate material which employs a roller seal system is described in U.S. Pat. No. 5,314,539 to Robert W. Brown, et al. This patent describes a vacuum chamber for the treatment of materials of continuous length (e.g., films for photographic support) using a multiple roller system. In the system described, a single vacuum treatment chamber is divided into multiple sub-chambers. Roller systems separate the sub-chambers from each other, and transport the continuous material through the sub-chambers. For example, three rollers may be placed side-by-side across a vacuum chamber to divide the chamber into two sub-chambers. Outer side rollers in each three roller system have non-compliant surfaces, which are sealed to the vacuum chamber walls via face sealing elements composed of a rigid material resiliently biased into engagement with the outer side roller surfaces. A central roller in the three roller system has a compliant outer surface. A bi-dimensional material is transported from a first sub-chamber to a second sub-chamber between a first outer side roller and the central roller of the three roller system, and back out of the second sub-chamber into the first sub-chamber between the other outer side roller of the three roller system and the central roller. End sealing (sealing between the vacuum chamber walls and the roller end surfaces) is achieved using elongated end-sealing elements. These sealing elements extend across the rollers between the roller end surfaces and a chamber wall. This arrangement assures an uninterrupted sealing surface at the roller ends. The individual sub-chambers created by multiple roller systems positioned within a single vacuum chamber may be separately evacuated. By creating individual vacuum stages, a very low vacuum level can be achieved in at least one of the sub-chambers. Plasma treatment, under DC or RF conditions, can take place in this chamber. A significant limitation of the multi-stage vacuum system described by Brown, et al., and of most other systems employing roller seals, is the complexity of the system and, specifically, the high number of roller seals employed to achieve effective sealing of the reaction chamber. Problems associated with the use of numerous rotating and stationary large sealing surfaces in roller sealing systems limits the ability to employ such systems in industrial settings.

SUMMARY OF THE INVENTION

The present invention provides a highly effective system for transporting a bi-dimensional substrate through a reaction chamber for the surface treatment thereof, while sealing the chamber from the outside environment. In accordance with the present invention, sealing of the reaction chamber is achieved using a sealing roller assembly employing either three or four sealing rollers. The rollers in a sealing roller assembly in accordance with the present invention are arranged such that only one of the sealing rollers is located partially within the reaction chamber, the other sealing rollers are located outside of the chamber. At any one time, only a small portion of the surface area of the sealing roller system is exposed to the interior of the reaction chamber. Thus, deposition created contamination of the sealing roller assembly is minimized, and cleaning requirements are reduced. In accordance with the present invention, a reaction chamber for the surface treatment of bi-dimensional materials preferably has a minimum active volume, thereby eliminating "dead" volumes which favor undesired deposition reactions.

A reaction chamber for the surface treatment of bi-dimensional substrates in accordance with the present invention is defined by two side walls, a reactor cover, a reactor opening which is sealed by a sealing roller assembly in accordance with the present invention, and two end walls or face plates. The side walls are preferably substantially flat elongated walls made of structural material, such as stainless steel. The side walls are preferably positioned at angles to each other to create a wide opening between first ends of the side walls and a more narrow opening between second ends of the side walls. Vacuum ports may be formed in the side walls for evacuating the reaction chamber. A gas channeling mechanism is preferably provided to distribute vacuum pressure applied to the vacuum ports to prevent displacement of a bi-dimensional substrate in the reaction chamber by the vacuum pressure.

The reactor cover is attached to the side walls between the first ends of the side walls, to thereby close the first opening between the side walls. The reactor cover is attached to the side walls such that a seal is achieved between the cover and the side walls. The reactor cover is preferably semi-cylindrical in shape, such that the cover creates a concave interior surface with respect to the interior of the reaction chamber. Electrodes are mounted on the inside concave surface of the reactor cover. Preferably, the electrodes are mounted in a semi-cylindrical Teflon electrode holder, which may be removably mounted within the reactor cover. A high voltage electrical connection to the electrodes and a gas inlet port are preferably provided through the reactor cover. A reactive gas surface treatment material may be admitted into the reaction chamber through the gas inlet port.

The second ends of the reactor side walls form an opening into the interior of the reaction chamber. It is through this opening into the reaction chamber that a bi-dimensional substrate material is passed into and out of the interior of the chamber for surface treatment. In accordance with the present invention, the opening into the interior of the reaction chamber is sealed by either a three-roller or a four-roller assembly.

A four-roller assembly in accordance with the present invention includes two side rollers, an inside roller, and an outside roller. The inside and outside rollers preferably have non-compliant surfaces. For example, the inside and outside rollers may be covered with a hard Teflon coating. The inside and outside rollers are positioned separated from each other such that the axes of the inside and outside rollers are perpendicular to a first imaginary line. The two side rollers in the four-roller assembly preferably have a more compliant surface than the inside and outside rollers. For example, the side rollers may be covered with a soft Teflon coating. The side rollers are positioned separated from each other such that the axes of the side rollers are perpendicular to a second imaginary line which is perpendicular to the first imaginary line. Each side roller is positioned to form a transport contact point between each of the inside and outside rollers. The side rollers and the inside and outside rollers of a four-roller assembly in accordance with the present invention form a roller assembly chamber bounded by each of the rollers. The roller assembly chamber may be separately evacuated. The four-roller assembly is mounted onto the reactor to seal the opening in the reaction chamber by positioning the inside roller partially within the reaction chamber such that the second end of each side wall of the reactor contacts an outer surface of one of the side rollers. A seal, which may, for example, be formed of a rod of rigid material, such as Teflon, is placed along the second ends of the reactor side walls, between the second ends of the side walls and the surfaces of the side rollers, to create a seal between the side rollers, and, therefore, the roller assembly, and the reactor side walls. Preferably, the opening between the second ends of the reactor side walls and the inside roller are sized such that the diameter of the inside roller is only slightly smaller than the reaction chamber opening. In this manner, the amount of surface area of the side rollers exposed to the interior of the reaction chamber is minimized.

A three-roller assembly in accordance with the present invention may be formed by eliminating the outside roller from the four-roller assembly just described. Alternatively, the three rollers in a three-roller assembly may be positioned such that two side rollers and a central inside roller are mounted side by side such that the axes of the three rollers are parallel to each other and approximately perpendicular to the same line. A three-roller assembly is mounted over the reaction chamber opening such that a surface of each side roller is mounted against one of the second ends of the reactor side walls. The central inside roller is thus centrally positioned across the reaction chamber opening. Preferably, the reaction chamber opening and the diameter of the central inside roller are sized such that the reaction chamber opening between the second ends of the reactor side walls is only slightly larger than the diameter of the central inside roller. In this manner, the surface area of the side roller surfaces exposed to the interior of the reaction chamber is minimized.

Sealing at the ends of the rollers in the roller assembly is achieved with minimal surface contact between the rollers and a roller assembly face plate. At each end of a roller in the roller assembly the diameter of the roller is reduced gradually, i.e., to form the frustum of a cone at each end of the roller. A ring of hard material, such as Teflon, is mounted around the end of the roller at the base of the frustum of the cone thus formed. This ring of Teflon or other material is pressed in contact with a corresponding portion of a roller assembly face plate, to form a seal at the end of the roller. An axle, having a diameter less than the diameter of the roller, extends from the roller through or into the roller assembly face plate. A ball bearing assembly mounted on or within the roller assembly face plate around the roller axle supports the roller for rotational movement in the roller assembly face plate. A seal, such as an O-ring seal, mounted around the roller axle between the surface of the roller axle and the roller assembly face plate, provides an additional end seal for the roller. A sealed space is thus created between the axle seal and the roller end seal, creating a chamber which may, if desired, be separately evacuated.

Reactor end walls or face plates are mounted at either end of the reaction chamber to form a seal between the reactor side walls, cover, and roller assembly.

In accordance with the present invention, the active volume of the reaction chamber defined by the side walls, reactor cover, roller assembly, and face plates, is reduced to a minimum. A large diameter freely rotating roller made, e.g., of stainless steel, is mounted within the reaction chamber, between the reaction chamber face plates, to rotate freely therein. The radius of the freely rotating roller is preferably only slightly smaller than the radius of the inside arc formed by the reaction chamber cover, with the electrodes and electrode holder mounted therein. The freely rotating roller can thus be mounted in the reaction chamber such that the surface of the freely rotating roller is very close to the surface of the electrode holder mounted within the reactor cover. The freely rotating roller thus preferably occupies most of the space within the reaction chamber. The freely rotating roller is also preferably electrically grounded and may be water cooled.

A support piece, e.g., made of stainless steel, is shaped to fit in the reaction chamber between the freely rotating roller and the roller assembly, such that the support piece occupies most of the remaining space in the reaction chamber, but without interfering with rotation of the freely rotating roller or the rollers in the roller assembly, or interfering with transport of a bi-dimensional substrate material through the reaction chamber.

The rollers in a roller assembly in accordance with the present invention are driven in a conventional manner, e.g., using a DC servo motor, to transport a bi-dimensional substrate material through the reaction chamber. In a reactor employing a four-roller assembly in accordance with the present invention, a bi-dimensional substrate material to be treated is transported through the reaction chamber by passing the material first between the outside roller and a first side roller (into the roller assembly chamber), between the inside roller and the side roller (into the reaction chamber), around the freely rotating roller (past the electrodes mounted under the reactor cover), between the inside roller and the other side roller (back into the roller assembly chamber), and out between the side roller and the outside roller. In a reactor employing a three-roller assembly in accordance with the present invention, the bi-dimensional substrate to be treated is passed between a side roller and the central inside roller into the reaction chamber, around the freely rotating roller within the reaction chamber, and back out of the reaction chamber between the central inside roller and the other side roller. Proper spacing between the rollers creates transport contact points between the rollers where the rollers grab the bi-dimensional substrate and seal the reaction chamber.

Surface treatment of a bi-dimensional substrate using a gas reactor employing an outside roller sealing system in accordance with the present invention is achieved by evacuating the reaction chamber, via vacuum lines attached to the vacuum ports in the side walls of the reaction chamber. Simultaneously, a reactive-gas may be admitted into the chamber through the gas inlet port. The reactive gas is admitted into the chamber near to both the substrate to be treated, which is carried by the freely rotating roller, and the reaction chamber electrodes. The bi-dimensional substrate is transported through the reaction chamber via the roller assembly in the manner described previously. A high voltage current signal is applied to the electrodes in the reaction chamber. A plasma state, such as a corona or RF discharge state, is thereby generated in the reaction chamber. As the bi-dimensional substrate passes through the plasma thus generated, the surface of the substrate material is altered in a desired manner. Since the reactor vacuum ports are located between the gas inlet port/electrodes and the roller assembly, plasma deposition contamination of the roller assembly is minimized.

A gas reactor employing an outside chamber sealing roller system in accordance with the present invention has several advantages over previously known reactors employing roller sealing systems. A reaction chamber in accordance with the present invention may be reduced to a low base pressure level (20 Torr, if a three-roller assembly is employed, less than one Torr, if a four-roller assembly is employed). Thus, the present invention makes possible a variety of plasma discharge mode surface treatment technologies, such as corona and RF discharge treatment, using a variety of reactive gases. Since the outside chamber sealing roller system of the present invention minimizes the sealing roller surface area exposed to the interior of the reaction chamber, deposition-based contamination of the sealing system is significantly reduced. Thus, the life time of the system is significantly prolonged, and smooth rolling of bi-dimensional substrates through the reaction chamber is maintained over a longer production run. Since the sealing rollers of the present invention can be provided as a separate assembly, easy removal and exchange of roller assemblies allows different roller assemblies (e.g., three-roller or four-roller assemblies) to be easily swapped out for different surface treatment processes. A removable roller assembly also facilitates easy cleaning of the sealing rollers and the reaction chamber as a whole.

A gas reactor in accordance with the present invention may be used for the surface functionalization of a variety of bi-dimensional substrates, e.g., films, fabrics, webs, paper, etc., using various reactive gases, and various plasma states, e.g., corona and RF, over a large pressure range. Thus, the present invention allows the creation of a variety of high value-added materials from economical polymers, e.g., hydrophobic or hydrophilic surface films, layers or fabrics; films with controlled liquid and gas-permeation characteristics; films and fabrics with improved dieability; sandwich composites from plasma-mediated adhesion-improved films and sheets, etc.

DETAILED DESCRIPTION OF THE INVENTION

Figure 1:
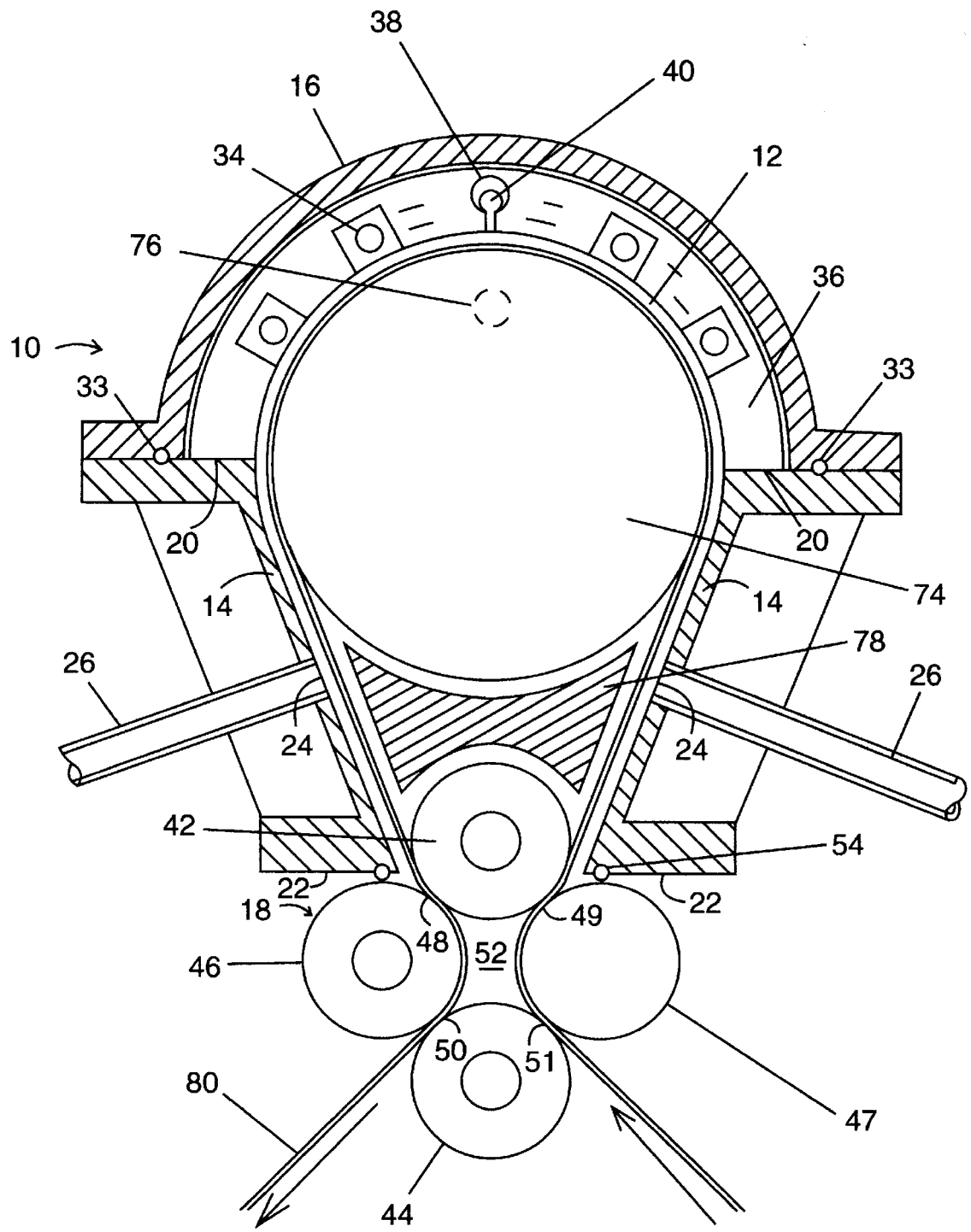
FIG. 1 is a cross-sectional view of an exemplary gas reactor for the surface treatment of a continuous bi-dimensional substrate employing a four-roller outside chamber sealing roller system in accordance with the present invention.

An exemplary embodiment of a gas reactor for the surface treatment of continuous bi-dimensional substrates, employing an outside chamber sealing roller system in accordance with the present invention, is illustrated in cross-section generally at 10 in FIG. 1, and will be described in detail with reference thereto. The reactor 10 of the present invention includes a vacuum-sealed gas reaction chamber 12. The reaction chamber 12 is defined by side walls 14, a reactor cover 16, a sealing roller assembly 18, and end walls or face plates (not shown in FIG. 1). The side walls 14, reactor chamber cover 16, and roller assembly 18 may be of virtually any length, to thereby accommodate any width of continuous bi-dimensional substrate material for the surface treatment thereof.

The side walls 14 of the gas reactor 10 are preferably formed at angles to each other such that the reaction chamber 12 defined by the side walls 14 is wider between first ends 20 of the side walls 14 than between second ends 22 of the side walls 14. Vacuum ports 24 are preferably provided in at least one, and preferably both, side walls 14. Vacuum lines 26 are connected in fluid communication with the vacuum ports 24. Vacuum pressure applied to the vacuum lines 26 is used to evacuate the reaction chamber 12 through the vacuum ports 24 in the side walls 14.

As will be described in more detail below, a bi-dimensional substrate being transported through the reaction chamber 12 will pass near the vacuum ports 24 in the side walls 14. A strong vacuum pressure applied to the vacuum lines 26 could displace the substrate as it is transported past the ports 24. Movement of a substrate being treated in the reaction chamber 12 could adversely affect the smooth movement of the substrate material through the reaction chamber 12 and, therefore, adversely affect the surface treatment process itself. In accordance with the present invention, a gas-channeling system is preferably employed in combination with the vacuum ports 24 in the reactor side walls 14 to distribute the vacuum pressure applied by the vacuum lines 26 along the length of the reaction chamber 12.

Figure 2:
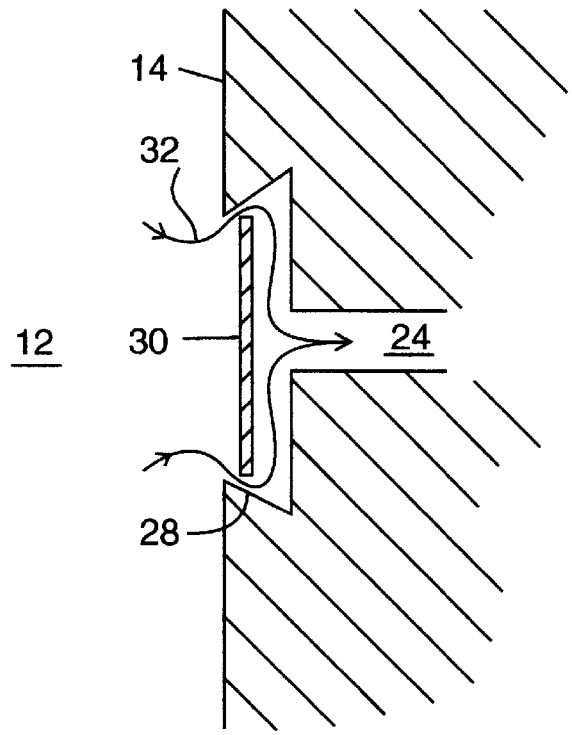
FIG. 2 is a detailed cross-sectional view of a gas-channeling system for use in combination with a vacuum port for a gas reactor in accordance with the present invention.

An exemplary gas-channeling system in accordance with the present invention is illustrated in FIG. 2. The vacuum port 24 in a reactor side wall 14 may be implemented as a simple hole through the side wall 14, to which the vacuum line 26 is attached. A channel 28 is formed along the length of the side wall 14 inside the reaction chamber 12 and in fluid communication with the vacuum port 24. The channel 28 is preferably much wider than the port 24. A gas channeling plate 30 is positioned along the length of the side wall 14 within the channel 28. The gas-channeling plate 30 is sized such that vacuum pressure applied to the vacuum port 24 will draw gas 32 from the interior of the reaction chamber 12 around the sides of the plate 30 into the channel 28 and through the vacuum port 24 in the side wall 14. Vacuum pressure applied to the vacuum port 24 by the vacuum line 26 is thus distributed along the length of the side wall 14. Displacement of a bi-dimensional substrate passing through the reaction chamber 12 near the vacuum port 24 by the vacuum pressure applied by vacuum line 26 is thus avoided. Note that the channel 28 may preferably be shaped such that the gas channeling plate 30 is retained within the channel 28 and may be slid into the channel 28 from an end or face of the reactor 10 when an end wall or face plate is removed therefrom.

The reactor cover 16 is securely attached to the first ends 20 of the side walls 14. A sealing mechanism, such as an O-ring seal 33, is placed between the reactor cover 16 and the ends 20 of the side walls 14 to provide a vacuum-tight seal. The reactor cover 16 is preferably bolted or otherwise securely and removably attached to the ends 20 of the side walls 14. The reactor cover 16 is preferably semicylindrical in shape, that is, the cover 16 has a semicircular or arc-shaped interior cross-section.

One or more electrodes 34 are mounted to the inside of the reactor cover 16 within the reaction chamber 12. The electrodes 34 may be implemented in a conventional manner, such as using a metal filament encased in a dielectric material, e.g., ceramic. The electrodes 34 are preferably mounted in an electrode holder 36. The electrode holder 36 is preferably removably mounted within the reactor cover 16. The electrode holder 36 may preferably be made of a dielectric material such as Teflon. The electrode holder 36 is also semicylindrical in shape. The electrodes 34 mounted in the electrode holder 36 are preferably connected together to a single high voltage electrode lead 38 (illustrated schematically in FIG. 1). The electrode lead 38 is preferably passed out of the reaction chamber 12 through an end wall or face plate thereof. A gas inlet port 40 is preferably also formed in the electrode holder 36. The gas inlet port 40 preferably extends along the length of the electrode holder 36, and is in fluid communication with a source of reactive gas. The reactive gas source is preferably connected to the gas inlet 40 at an aperture in an end wall or face plate of the reactor 10. Conventional sealing may be provided at the points where the high-voltage electrode lead 38 passes through the end wall or face plate of the reactor, and where a gas supply line is connected to the gas inlet port 40 at the end wall or face plate. Note that positioning the gas inlet 40 in the electrode holder 36 insures that reactive gas admitted into the reaction chamber 12 will be admitted near the electrodes 34 which will be used to generate a plasma in the reactive gas, and will be evacuated through the vacuum ports 24 in the side walls 14 before reaching the roller assembly 18.

The roller assembly 18 seals the reaction chamber 12 at the opening defined by the second ends 22 of the reactor side walls 14. In accordance with the present invention, either a three-roller or four-roller assembly may be employed. An exemplary four-roller assembly will be described with reference with FIG. 1. Use of a four-roller assembly 18 allows very low pressure levels (less than one Torr) to be achieved within the reaction chamber 12.

The four-roller assembly 18 includes an inside roller 42, an outside roller 44, and two side rollers 46 and 47. As illustrated in FIG. 1, the inside roller 42 and outside roller 44 are positioned separated from each other such that the axes of the inside 42 and outside 44 rollers are perpendicular to a first imaginary line. The side rollers 46 and 47 are positioned separated from each other such that the axes of the side rollers 46 and 47 are perpendicular to a second imaginary line. The inside 42 and outside rollers 44 are positioned with respect to the side rollers 46 and 47 such that the inside roller 42 forms a transport contact point 48 with the first side roller 46 and a transport contact point 49 with the second side roller 47, and such that the outside roller 44 forms a transport contact point 50 with the first side roller 46 and a transport contact point 51 with the second side roller 47. The rollers 42, 44, 46, and 47 are positioned such that the first and second imaginary lines are at right angles to each other. As will be described in more detail below, a bi-dimensional substrate to be transported into the reaction chamber 12 for treatment is transported by the roller assembly 18 through the transport contact points which also seal the reaction chamber 12. Note that the transport contact points 48–51 also define seals for a roller assembly chamber 52, defined by the roller assembly rollers, which may be separately evacuated through a roller assembly face plate (not shown in FIG. 1). When both the reaction chamber 12 and the roller assembly chamber 52 are evacuated, a very low vacuum level (less than one Torr) can be achieved in the reaction chamber 12.

The rollers 42, 44, 46, and 47 may be made, for example, of stainless steel. Preferably, the inside 42 and outside 44 rollers are covered with a relatively non-compliant material, e.g., hard Teflon, such that the inside 42 and outside 44 rollers have relatively hard non-compliant roller surfaces.

The side rollers 46 and 47 are preferably covered with a relatively compliant material, e.g., soft Teflon, such that the side rollers 46 and 47 have relatively compliant surfaces. Thus, each transport contact point 48–51 is formed by a relatively compliant and a relatively non-compliant surface. This combination of compliant and non-compliant roller surfaces allows proper control of the pressure exerted by the rollers on the bi-dimensional substrate transported by the roller assembly through the transport contact points 48–51. Different degrees of compliance in the roller surfaces may be used depending on the nature of the bi-dimensional substrate material to be transported through the roller assembly 18.

The roller assembly 18 is attached to the second ends 22 of the side walls 14 of the reactor 10 such that only the inside roller 42 is partially located within the reaction chamber 12. Preferably, the distance between the second ends 22 of the side walls 14 and the size of the inside roller 42 are selected such that there is minimal clearance between the inside roller 42 and the side walls 14 when the roller assembly 18 is attached to the side walls 14. Thus, only a very small portion of the surface area of the side rollers 46 and 47 will be exposed at any one time to the reaction within the reaction chamber 12. A seal is achieved between the second ends 22 of the side walls 14 and the roller assembly 18 by a sealing rod 54 mounted in the second end 22 of each side wall 14. A sealing rod 54, which may be made of a material such as polished steel, is positioned along the second ends 22 of the side walls 14 between the second ends 22 of the side walls 14 and the surfaces of the side rollers 46 and 47. The roller assembly 18 is attached to the second ends 22 of the side wall 14 such that sufficient compression is achieved between the side rollers 46 and 47 and the sealing rods 54 to achieve a seal between the roller assembly 18 and the side walls 14 while allowing rotation of the side rollers 46 and 47. (Note that sealing of the side roller surfaces may also be achieved within the roller assembly 18. A sealing end may be used to seal the side roller surfaces to a wall of the roller assembly. This roller assembly wall may then be mounted in a sealed relation to the ends 22 of the reactor side walls 14.)

Figure 3:
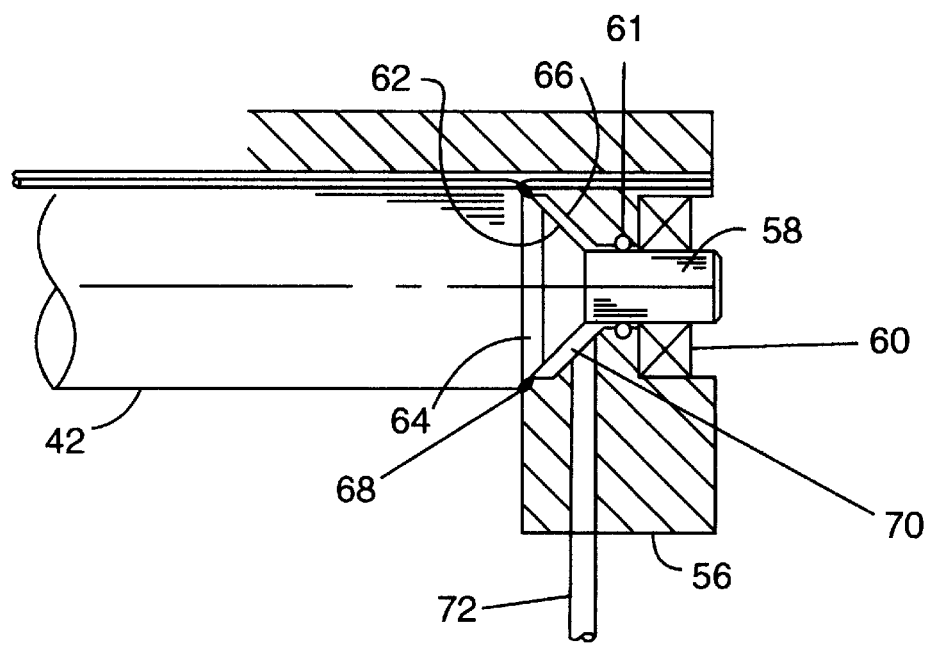
FIG. 3 is a detailed view, in partial cross-section, of a preferred system for sealing the ends of a roller in an outside chamber sealing roller system in accordance with the present invention.

The ends of the roller assembly 18 are sealed by roller assembly face plates 56 (see FIG. 3). A preferred system for achieving a vacuum seal between the ends of the rollers in the roller assembly 18 and the roller assembly face plates 56 is described with reference to FIG. 3. For simplicity, FIG. 3 shows a side view of one end of the inside roller 42 of the roller assembly 18 having a roller assembly face plate 56 attached thereto. A seal between the roller assembly face plate 56 and the other rollers in the roller assembly 18 may be achieved in the same manner as will be described.

The roller 42 is supported in the roller assembly face plate 56 by an axle 58 which extends from the roller 42 into or through the face plate 56. The roller axle 58 is supported by a conventional bearing assembly 60 mounted in or on the roller assembly face plate 56, which allows free rotation of the roller 42. A gear assembly (not shown in FIG. 3) may also be attached to the axle 58 to provide a means for driving the rotation of the roller 42 in a conventional manner by use, for example, of a conventional DC servo motor. A seal, such as an O-ring seal 61, provides a seal between the roller axle 58 and the aperture in the roller assembly face plate 56 through which the axle is positioned.

The roller axle 58 preferably has a smaller diameter than the diameter of the roller 42 itself. A transition surface 62 of the roller 42 between the roller surface and the surface of the roller axle 58 preferably has the shape of the frustum of a cone. A portion 64 of this transition surface 62 of the roller 42 is formed of or covered by a hard sealing material. A Teflon ring may be attached to the roller 42 for this purpose. The transition surface 62 of the roller 42 is seated in a corresponding pocket 66 formed in the roller assembly face plate 56. The edge of the pocket 66 formed in the face plate 56 contacts the Teflon coated portion 64 of the transition surface 62 to form a continous sealing contact point 68 around the end of the roller 42 between the roller 42 and the face plate 56. The roller assembly face plate 56 is mounted onto the rollers in the roller assembly 18 with sufficient compressive force to provide a seal at the sealing point 68 between the roller 42 and the face plate 56 while allowing rotation of the roller 42. The method for sealing the ends of the rollers in a roller assembly 18 as just described achieves effective sealing between the rollers and the roller assembly face plate 56, while minimizing axial surface contact between the rollers in the roller assembly 18 and the roller face plate 56. It should be noted that the sealing method just described creates a chamber 70 between the roller end sealing point 68 and the seal 61 formed between the roller axle 58 and the face plate 56. This chamber 70 may be separately evacuated through the roller assembly face plate 56, e.g., via a vacuum line 72. Evacuation of this chamber 70 allows very low vacuum levels to be achieved in the reaction chamber 12.

End walls or face plates (not shown in FIG. 1) are attached to the side walls 14, reactor cover 16, and roller assembly 18 at each end of the reactor 10 to close the reaction chamber 12. A vacuum seal is achieved between the end plates and the side walls 14, reactor cover 16, and roller assembly 18, in a conventional manner, using, for example, an O-ring type seal.

The active volume within the reaction chamber 12 is preferably reduced to a minimum. This is achieved, in part, by mounting a large diameter freely rotating roller 74 within the reaction chamber 12. The freely rotating roller 74 is preferably made of stainless steel. The ends of the freely rotating roller are preferably mounted in the end walls or face plates of the reactor 10 in a conventional manner, using, e.g., a conventional ball-bearing assembly, such that the roller 74 rotates freely within the reactor 10. The radius of the freely rotating roller 47 is made slightly less than the radius of the inside surface of the electrode holder 36 mounted within the reactor cover 16. The freely rotating roller 74 may thus be mounted along the axis of the reactor cover 16, and the electrode holder 36, such that only a small volume remains between the surface of the electrode holder 36 and the surface of the freely rotating roller 74. Thus, the electrode holder 36 and the freely rotating roller 74 act in conjunction to reduce the dead volume within the reaction chamber 12, and, in particular, to reduce the volume in which plasma will be generated for surface treatment of a bi-dimensional substrate. As will be discussed in more detail below, a plasma is generated in the reaction chamber 12 between the electrode holder 36 and the freely rotating roller 74. A bi-dimensional substrate to be treated is passed through the plasma on the freely rotating roller 74. The freely rotating roller 74 is preferably electrically grounded, as illustrated by schematic ground connector 76. The ground connection 76 to the freely rotating roller 74 may be implemented in a conventional manner using, e.g., a brush or roller contact to the roller 74. The freely rotating roller 74 may also be water cooled, such as by running water through a hollow portion of the roller 74 using, e.g., a rotating water coupling (not shown).

To further reduce the active volume within the reaction chamber 12, a support piece 78, shaped to occupy as much as possible of the remaining portion of the reaction chamber 12 which is not occupied by either the freely rotating roller 74 or the inside sealing roller 42, without interfering with the rotation of either the freely rotating roller 74 or the inside roller 42 or the transport of a substrate material through the reaction chamber 12, is preferably mounted within the reaction chamber between the freely rotating roller 74 and the inside roller 42. The support piece 78 may be made of a material such as stainless steel, and may be supported in position within the reaction chamber 12 by attaching the support piece 78 to the end walls or face plates of the reactor 10.

The transport of a bi-dimensional substrate 80 through the reaction chamber 12 in a manner such that the reaction chamber 12 remains sealed from the outside environment will now be described with reference to FIG. 1. The bi-dimensional substrate 80 is first passed between the outside roller 44 and one of the side rollers 47 of the roller assembly 18 at transport contact point 51 into the roller assembly chamber 52. From there, the bi-dimensional substrate 80 is passed between the inside roller 42 and the side roller 47 at transport contact point 49 into the reaction chamber 12. The bi-dimensional substrate 80 is carried through the reaction chamber 12 past the electrodes 34 by the freely rotating roller 74. The bi-dimensional substrate 80 is then passed between the inside roller 42 and the other side roller 46 at transport contact point 48 out of the reaction chamber 12 and into the roller assembly chamber 52. From there, the bi-dimensional substrate 80 is passed between the outside roller 44 and the side roller 46 at transport contact point 50 out of the roller assembly 18. The rollers 42, 44, 46, and 47 in the roller assembly 42 are positioned sufficiently close to each other such that the bi-dimensional substrate 80 is pinched between the rollers at the transport contact points 48–51 such that the rollers grab the bi-dimensional substrate material 78 to transport the material into and out of the reaction chamber 12 without slipping and such that there is minimum gas leakage through the transport contact points 48–51. As discussed previously, the surfaces of the inside 42 and outside 44 rollers are preferably covered with a relatively non-compliant material, and the surfaces of the side rollers 46 and 47 are preferably covered with a relative compliant material to allow proper control of the pressure exerted by the rollers on the bi-dimensional substrate 78. The rollers in the roller assembly may be rotated in a conventional manner using, e.g., a DC servo motor and an appropriate gear configuration to turn the rollers in the roller assembly 18 to transport the bi-dimensional substrate material 80 through the roller assembly 18 into and out of the reaction chamber 12 at a desired rate. A conventional brake mechanism on a supply roll of the bi-dimensional substrate material 80 (not shown) and a conventional air motor on the take-up roll for the bi-dimensional substrate material 80 (not shown) assure proper tensioning of the substrate 80 between the supply and take-up rolls and the roller assembly 18.

Figure 4:
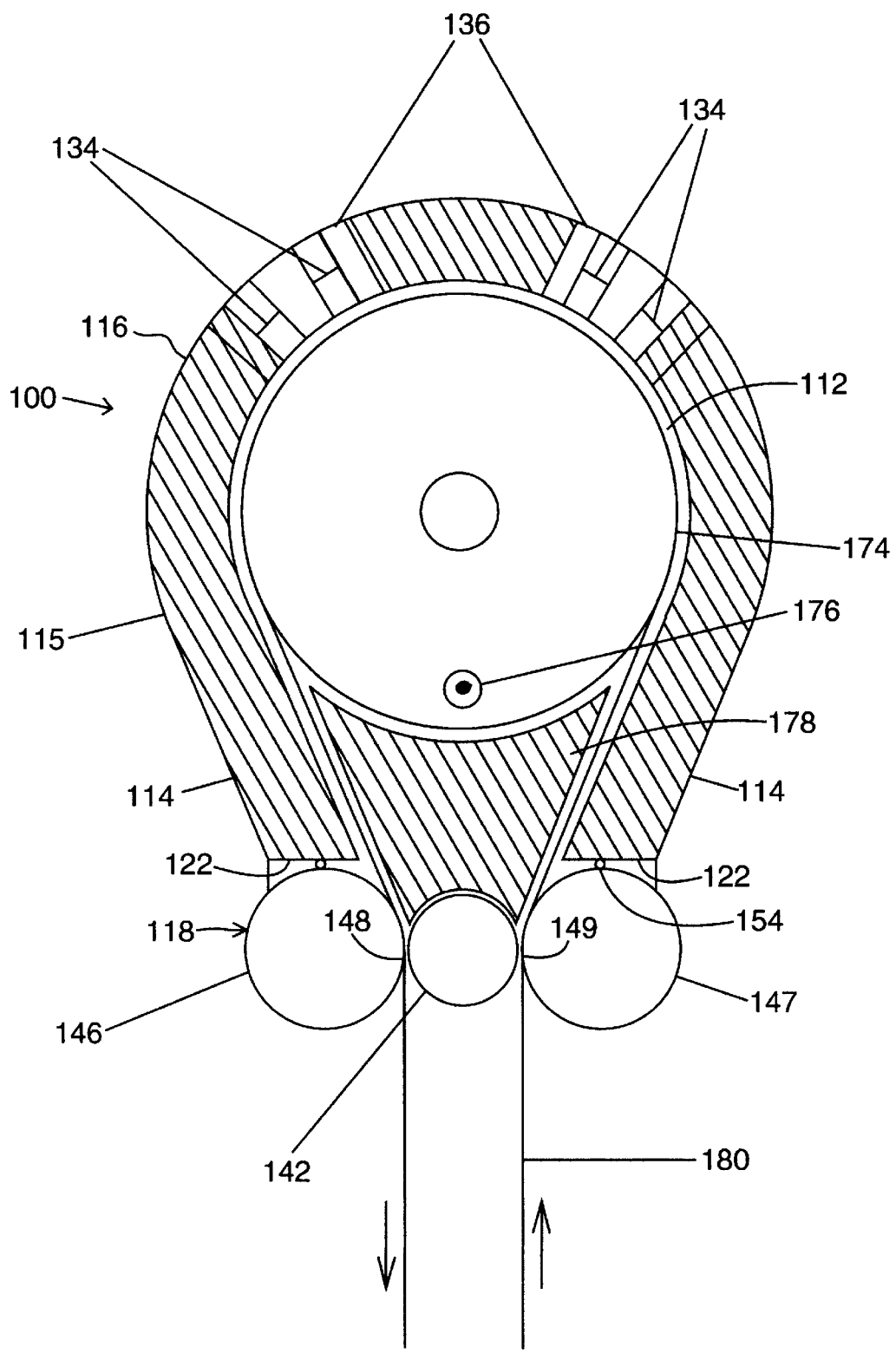
FIG. 4 is a cross-sectional view of an exemplary gas reactor employing a three-roller outside chamber sealing roller system in accordance with the present invention.

An exemplary alternative embodiment of a gas reactor employing an outside chamber sealing roller system in accordance with the present invention is illustrated generally at 100 in FIG. 4. In the exemplary alternative embodiment gas reactor 100, a reaction chamber 112 is defined by a reactor housing 115, a roller assembly 118, and end walls or face plates (not shown).

The reactor housing 115 of the gas reactor 100 illustrated in FIG. 4 corresponds to the reactor side walls 14 and cover 16 of the reactor 10 illustrated in FIG. 1. Thus, FIG. 4 illustrates that the reactor side walls and cover may be formed as a single piece. As illustrated, the reactor housing 115 preferably has a generally horseshoe-shaped cross-section, including an arched portion 116 and relatively straight side wall portions 114. The side wall portions 114 terminate at ends 122 thereof, which define an opening into the reaction chamber 112. Although not illustrated in FIG. 4, vacuum ports and a gas inlet port are preferably formed in the reactor housing 115, preferably in the straight side wall 114 and arched 116 portions thereof, respectively, as described previously with respect to FIG. 1.

Electrodes 134 are mounted in the arched portion 116 of the reactor housing 115. The electrodes 134 are mounted in electrode holders 136 made, e.g., of a dielectric material such as Teflon, which, in turn, are mounted into the reactor housing 115 and sealed thereto in a conventional manner. As illustrated in FIG. 4, not all of the electrodes 134 need be mounted in a single electrode holder 136. As discussed previously, the electrodes 134 may be implemented in a conventional manner, and a high voltage electrical connection (not shown) is provided to the electrodes 134.

The roller assembly 118 seals the open end of the reaction chamber 112 between the ends 122 of the reactor housing 115. In the exemplary embodiment of FIG. 4, a three-roller assembly is employed. The three-roller assembly 118 features a central inside roller 142 and two side rollers 146 and 147. Preferably, the central inside roller 142 has a relatively noncompliant surface, e.g., is covered with relatively hard Teflon, and the side rollers 146 and 147 have a relatively more compliant surface, e.g, are covered with a softer Teflon. The rollers in the roller assembly 118 are positioned with respect to each other such that transport points 148 and 149 are formed, respectively, between the central inside roller 142 and one side roller 146 and the central inside roller 142 and the other side roller 147. The three roller assembly 118 may have the configuration of the four roller assembly 18 described with references to FIG. 1, but with the outside roller 44 eliminated. Alternatively, the rollers in the roller assembly 118 are positioned with respect to each other such that the axes of the rollers 142, 146, and 147 are perpendicular to the same imaginary line (as illustrated in FIG. 4). The roller assembly 118 is positioned with respect to the reactor housing 115 such that the central inside roller 142 is positioned across the opening between the ends 122 of the reactor housing 115. Preferably, the roller assembly 118 and reactor housing 115 are sized and shaped such that a minimum surface area of the central inside roller 142 and side rollers 146 and 147 is exposed to the inside of the reaction chamber 112 at any one time. A seal is achieved between the roller assembly 118 and the reactor housing 115 using, e.g., a rod of hard material 154, for example, polished steel, positioned along the ends 122 of the reactor housing 115 between the reactor housing 115 and the side rollers 146 and 147 of the roller assembly 118. As described previously with respect to FIG. 1, the roller assembly 118 is assembled onto the reactor housing 115 such that the surfaces of the outside rollers 146 and 147 of the roller assembly 118 are pressed against the roller seal 154 with sufficient force to provide a seal without interfering with rotation of the rollers 146 and 147. The ends of the rollers in the roller assembly 118 are preferably sealed as described previously with reference to FIG. 3.

As described previously, with respect to FIG. 1, the ends of the reactor 100 are sealed by end walls or face plates (not shown in FIG. 4). A seal between the end walls or face plates and the reactor housing 115 is achieved in a conventional manner, using, e.g., O-ring type seals.

As described previously, with respect to FIG. 1, the active volume of the reaction chamber 112 is preferably minimized. A large freely rotating roller 174 is positioned within the reactor housing 115. The radius of the freely rotating roller 174 is preferably only slightly smaller than the inside radius of the arched portion 116 of the reactor housing 115. Thus, when the freely rotating roller 174 is positioned within the reactor housing 115 adjacent the arched portion 116 thereof, only a small volume exists between the surface of the freely rotating roller 174 and the inside of the arched portion 116 of the reactor 115 where the electrodes 134 are positioned. The freely rotating roller 174 is preferably made of a material such as stainless steel, and may be mounted within the reaction chamber 112 in any conventional manner. The freely rotating roller 174 is preferably grounded, using, e.g., a brush or roller ground connection 176. As will be discussed in more detail below, the freely rotating roller 174 transports a bi-dimensional substrate to be treated through a plasma generated under the arched portion of the reactor housing 115 by the electrodes 134. To further reduce the active volume within the reaction chamber 112, a support piece 178, as described with references to FIG. 1, is preferably also placed within the reaction chamber between the freely rotating roller 174 and the roller assembly 118.

Transport of a bi-dimensional substrate 180 through the exemplary reactor 100 of FIG. 4 will now be described with reference to FIG. 4. The bi-dimensional substrate material 180 is supplied from a supply roller (not shown) and returned to a take-up roller (also not shown). As discussed previously, a conventional braking mechanism on the supply roller and a conventional air motor on the take-up roller may be used, for example, to maintain proper tensioning on the bi-dimensional substrate 180 between the supply and take-up rollers and the roller assembly 118. The bi-dimensional substrate 180 is transported through the reactor 110 by the rollers in the roller assembly 118, which may be turned at the desired rate of speed by a conventional mechanism such as a DC servo motor and appropriate gear connections. The bi-dimensional substrate 180 is passed into the reaction chamber 112 at transport contact point 149 between the central inside roller 142 and side roller 147. The bi-dimensional substrate 180 is carried through the reaction chamber 112 past the electrodes 134 by the freely rotating roller 174. The bi-dimensional substrate 180 is transported out of the reaction chamber 112 past transport contact point 148 formed between the central inside roller 142 and side roller 146. The rollers in the roller assembly 118 are positioned sufficiently close to each other to grasp the bi-dimensional substrate 180 at the transport contact points 148 and 149 and to provide a seal at the transport contact points 148 and 149.

It should be noted that many of the features illustrated in the embodiment of the present invention illustrated in FIG. 4 may be incorporated in the embodiment of the present invention illustrated in FIG. 1, and vice versa. For example, the three-roller assembly 118 illustrated in FIG. 4 may be interchanged with the four-roller assembly 18 illustrated in FIG. 1.

A gas reactor employing an outside chamber sealing roller system in accordance with the present invention may be used for the surface treatment of any bi-dimensional substrate using any known plasma treatment process. This is achieved by evacuating the reaction chamber 12 or 112 (e.g., via vacuum lines 26), admitting a reactive gas (if desired) into the reaction chamber 12 or 112 (e.g., via gas inlet port 40), applying a high-voltage electrical current signal to the electrodes 34 or 134 to generate a plasma in the reaction chamber 12 or 112, and transporting the bi-dimensional substrate 80 or 180 through the reaction chamber 12 or 112 in the manner described to achieve the desired surface treatment. The sealing capability of an outside chamber sealing roller system in accordance with the present invention allows very low pressure levels to be achieved within the reaction chamber 12 or 112, and will prevent toxic reactive gases from escaping from the reaction chamber 12 or 112. Therefore, the type of gas used for plasma surface treatment is not limited, and any plasma discharge technique, e.g., corona discharge, and RF plasma technologies, may be employed. The effectiveness of surface functionalization of bi-dimensional substrates is enhanced by reducing the active volume of the reaction chamber. The lifetime of the sealing system of the present invention is enhanced by reducing the surface area of the rollers which are exposed to the interior of the reaction chamber. The outside chamber sealing roller system of the present invention may be formed as an assembly which may be made easily removable for cleaning and replacement.

It should be understood that terms defining specific shapes and relative positions, as used in the foregoing specification and the claims which follow, are understood to mean the exact shape and position specified, as well as similar and approximations of those shapes and positions. Such terms include, but are not limited to: semi-cylindrical, coaxial, arched, conformal, etc. It is also understood that the present invention is not limited to the applications and embodiments illustrated and described herein, but embraces such modified forms thereof as come within the scope of the following claims.

What is claimed is:

1. A gas reactor for the plasma surface treatment of a continuous bi-dimensional substrate, comprising:
   (a) a reactor housing defining a reaction chamber on an interior thereof and including reactor side walls, each reactor side wall having a first end, wherein the first ends of the reactor side walls define an opening into the reaction chamber;
   (b) a roller assembly including:
      (i) an inside roller having an inside roller surface and inside roller ends;
      (ii) an outside roller having an outside roller surface and outside roller ends and positioned such that the outside roller surface is parallel to and spaced apart from the inside roller surface;
      (iii) a first side roller having a first side roller surface and first side roller ends and positioned adjacent to both the inside roller surface and the outside roller surface such that the first side roller surface is parallel to the inside roller surface and forms a first transfer contact point between the first side roller surface and the outside roller surface and a second transfer contact point between the first side roller surface and the inside roller surface; and
      (iv) a second side roller having a second side roller surface and second side roller ends and positioned such that the second side roller surface is spaced apart from the first side roller surface and adjacent to both the inside roller surface and the outside roller surface such that the second side roller surface is parallel to the inside roller surface and forms a third transfer contact point between the inside roller surface and the second side roller surface, a fourth transfer contact point between the outside roller surface and the second side roller surface, and a roller assembly chamber defined by the inside roller surface, the outside roller surface, the first side roller surface, and the second side roller surface;
   wherein the roller assembly is attached in a sealed relation to the first ends of the reactor side walls to seal the opening into the reaction chamber and such that a portion of only the inside roller is positioned between the reactor side walls within the reaction chamber.

2. The gas reactor of claim 1 comprising additionally a vacuum port formed in at least one of the reactor side walls.

3. The gas reactor of claim 2 comprising additionally a channel formed along an inside of the reactor wall and in fluid communication with the vacuum port, and a gas channeling plate positioned within the channel to distribute the force of a vacuum pressure in the vacuum port along the channel.

4. The gas reactor of claim 1 wherein the reactor housing includes a reactor cover attached in a sealed relation to second ends of the reactor side walls.

5. The gas reactor of claim 4 wherein a distance between the second ends of the reactor side walls is greater than a distance between the first ends of the reactor side walls.

6. The gas reactor of claim 4 wherein an interior side of the reactor cover is semi-cylindrical in shape.

7. The gas reactor of claim 6 comprising additionally an electrode holder having a semi-cylindrical shape and having one or more electrodes mounted therein, wherein the electrode holder is mounted on the interior side of the reactor cover and coaxial thereto.

8. The gas reactor of claim 7 comprising additionally a gas inlet port formed in the electrode holder.

9. The gas reactor of claim 7 wherein the electrode holder is made of Teflon.

10. The gas reactor of claim 7 comprising additionally a freely rotating roller having a freely rotating roller surface mounted within the reaction chamber coaxial to an interior side of the electrode holder such that the freely rotating roller surface is parallel to the inside roller surface and conformal with and spaced apart from the interior side of the electrode holder.

11. The gas reactor of claim 10 wherein the freely rotating roller is made of stainless steel.

12. The gas reactor of claim 10 comprising additionally means for electrically connecting the freely rotating roller surface to ground.

13. The gas reactor of claim 10 comprising additionally a support piece mounted within the reaction chamber between the freely rotating roller and the inside roller and shaped to occupy a volume of the reaction chamber between the freely rotating roller and the inside roller without contacting the freely rotating roller or the inside roller.

14. The gas reactor of claim 13 wherein the support piece is made of stainless steel.

15. The gas reactor of claim 1 comprising additionally roller end sealing means for sealing the ends of at least some of the rollers in the roller assembly, including:
   (a) a sealing ring attached to the end of a roller to be sealed in coaxial relation thereto;
   (b) a face plate having a pocket formed therein having a pocket edge and attached to the roller assembly such that the pocket edge contacts the sealing ring to form a seal along an entire surface of the sealing ring.

16. The gas reactor of claim 15 wherein the sealing ring is made of Teflon.

17. The gas reactor of claim 15 comprising additionally a roller axle extending from the end of the roller to be sealed coaxial thereto into an aperture formed in the pocket in the face plate, wherein the diameter of the axle is less than the diameter of the roller and wherein the roller includes a transition surface of decreasing circumference between the roller surface and the axle and the sealing ring is mounted at an end of the transition surface adjacent to the roller surface such that the transition surface is positioned in the pocket formed in the face plate.

18. The gas reactor of claim 1 wherein the inside roller surface and the outside roller surface are less compliant than the first and second side roller surfaces.

19. The gas reactor of claim 1 wherein the roller assembly is removably attachable to the reactor housing.

20. The gas reactor of claim 1 wherein the roller assembly is sealed to the reactor housing by rod seals mounted in the first ends of the reactor side walls and extending along a length of the first and second side rollers.

21. A gas reactor for the plasma surface treatment of a continuous bi-dimensional substrate, comprising:
   (a) a reactor housing defining a reaction chamber on an interior thereof and including reactor side walls, each reactor side wall having a first end, wherein the first ends of the reactor side walls define an opening into the reaction chamber;
   (b) a roller assembly including:
      (i) a central inside roller having a central inside roller surface and central inside roller ends;
      (ii) a first side roller having a first side roller surface and first side roller ends and positioned adjacent to the central inside roller such that the first side roller surface is parallel to the central inside roller surface and forms a first transfer contact point between the first side roller surface and the central inside roller surface; and
      (iii) a second side roller having a second side roller surface and second side roller ends and positioned such that the second side roller surface is spaced apart from the first side roller surface and adjacent to the central inside roller surface such that the second side roller surface is parallel to the central inside roller surface and forms a second transfer contact point between the central inside roller surface and the second side roller surface;
   wherein the roller assembly is attached in a sealed relation to the first ends of the reactor side walls to seal the opening into the reaction chamber such that central inside roller is centered between the first ends of the reactor side walls and one-fourth or less of the first and second roller surfaces is exposed to the reaction chamber at any one time.

22. The gas reactor of claim 21 wherein the reactor housing includes an integrally formed arched portion between second ends of the reactor side walls.

23. The gas reactor of claim 22 wherein a distance between the second ends of the reactor side walls is greater than a distance between the first ends of the reactor side walls.

24. The gas reactor of claim 22 comprising additionally a freely rotating roller having a freely rotating roller surface mounted within the reaction chamber coaxial to the arched portion of the reactor housing such that the freely rotating roller surface is parallel to the central inside roller surface and conformal with and spaced apart from an interior side of the arched portion of the reactor housing.

25. The gas reactor of claim 24 wherein the freely rotating roller is made of stainless steel.

26. The gas reactor of claim 24 comprising additionally means for electrically connecting the freely rotating roller surface to ground.

27. The gas reactor of claim 24 comprising additionally a support piece mounted within the reaction chamber between the freely rotating roller and the central inside roller and shaped to occupy a volume of the reaction chamber between the freely rotating roller and the central inside roller without contacting the freely rotating roller or the central inside roller.

28. The gas reactor of claim 27 wherein the support piece is made of stainless steel.

29. The gas reactor of claim 21 comprising additionally roller end sealing means for sealing the ends of at least some of the rollers in the roller assembly, including:
   (a) a sealing ring attached to the end of a roller to be sealed in coaxial relation thereto;
   (b) a face plate having a pocket formed therein having a pocket edge and attached to the roller assembly such that the pocket edge contacts the sealing ring to form a seal along an entire surface of the sealing ring.

30. The gas reactor of claim 29 wherein the sealing ring is made of Teflon.

31. The gas reactor of claim 29 comprising additionally a roller axle extending from the end of the roller to be sealed coaxial thereto into an aperture formed in the pocket in the face plate, wherein the diameter of the axle is less than the diameter of the roller and wherein the roller includes a transition surface of decreasing circumference between the roller surface and the axle and the sealing ring is mounted at an end of the transition surface adjacent to the roller surface such that the transition surface is positioned in the pocket formed in the face plate.

32. The gas reactor of claim 21 wherein the central inside roller surface is less compliant than the first and second side roller surfaces.

33. The gas reactor of claim 21 wherein the roller assembly is removably attachable to the reactor housing.

34. The gas reactor of claim 21 wherein the roller assembly is sealed to the reactor housing by rod seals mounted in the first ends of the reactor side walls and extending along a length of the first and second side rollers.

35. A gas reactor for the plasma surface treatment of a continuous bi-dimensional substrate, comprising:
   (a) reactor side walls having first ends and second ends defining first and second openings between the reactor side walls;
   (b) a reactor cover attached in a sealed relation to the first ends of the reactor side walls to close the first opening between the reactor side walls, wherein the interior of the reactor cover is semi-cylindrical in shape;
   (c) an electrode holder having a semi-cylindrical shape and having one or more electrodes mounted therein, wherein the electrode holder is mounted on the interior side of the reactor cover and coaxial thereto;
   (d) a roller assembly attached in a sealed relation to the second ends of the reactor side walls to close the second opening between the reactor side walls;
   (e) a freely rotating roller having a freely rotating roller surface mounted in coaxial relation to an interior side of the electrode holder such that the freely rotating roller surface is conformal with and spaced apart from the interior side of the electrode holder; and
   (f) a support piece mounted between the freely rotating roller and the roller assembly and shaped to occupy a volume between the freely rotating roller and the roller assembly without contacting the freely rotating roller or the roller assembly.

36. The gas reactor of claim 35 wherein the roller assembly is a four roller assembly, comprising:
   (a) an inside roller having an inside roller surface and inside roller ends;
   (b) an outside roller having an outside roller surface and outside roller ends and positioned such that the outside roller surface is parallel to and spaced apart from the inside roller surface;

(c) a first side roller having a first side roller surface and first side roller ends and positioned adjacent to both the inside roller and the outside roller such that the first side roller surface is parallel to the inside roller surface and forms a first transfer contact point between the first side roller surface and the outside roller surface and a second transfer contact point between the first side roller surface and the inside roller surface; and (d) a second side roller having a second side roller surface and second side roller ends and positioned such that the second side roller surface is spaced apart from the first side roller surface and adjacent to both the inside roller and the outside roller such that the second side roller surface is parallel to the inside roller surface and forms a third transfer contact point between the inside roller surface and the second side roller surface, a fourth transfer contact point between the outside roller surface and the second side roller surface, and a roller assembly chamber defined by the inside roller surface, the outside roller surface, the first side roller surface, and the second side roller surface.

37. The gas reactor of claim 35 wherein the roller assembly is a three roller assembly, comprising:

(a) a central inside roller having a central inside roller surface and inside roller ends;

(b) a first side roller having a first side roller surface and first side roller ends and positioned adjacent to the central inside roller such that the first side roller surface is parallel to the central inside roller surface and forms a first transfer contact point between the first side roller surface and the central inside roller surface; and (c) a second side roller having a second side roller surface and second side roller ends and positioned such that the second side roller surface is spaced apart from the first side roller surface and adjacent to the central inside roller surface such that the second side roller surface is parallel to the central inside roller surface and forms a second transfer contact point between the central inside roller surface and the second side roller surface.

38. The gas reactor of claim 35 comprising additionally a vacuum port formed in at least one of the reactor side walls.

39. The gas reactor of claim 38 comprising additionally a channel formed along an inside of the reactor wall and in fluid communication with the vacuum port, and a gas channeling plate positioned within the channel to distribute the force of a vacuum pressure in the vacuum port along the channel.

40. The gas reactor of claim 35 wherein a distance between the first ends of the reactor side walls is greater than a distance between the second ends of the reactor side walls.

41. The gas reactor of claim 35 comprising additionally a gas inlet port formed in the electrode holder.

42. The gas reactor of claim 35 wherein the electrode holder is made of Teflon.

43. The gas reactor of claim 35 wherein the freely rotating roller is made of stainless steel.

44. The gas reactor of claim 35 comprising additionally means for electrically connecting the freely rotating roller surface to ground.

45. The gas reactor of claim 35 wherein the support piece is made of stainless steel.

* * * * *